(12) United States Patent
Hsu et al.

(10) Patent No.: US 8,199,522 B2
(45) Date of Patent: Jun. 12, 2012

(54) PRINTED CIRCUIT BOARD

(75) Inventors: Shou-Kuo Hsu, Tu-Cheng (TW);
Chun-Jen Chen, Tu-Cheng (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 404 days.

(21) Appl. No.: 12/497,709

(22) Filed: Jul. 6, 2009

(65) Prior Publication Data

US 2010/0321910 A1    Dec. 23, 2010

(30) Foreign Application Priority Data

Jun. 18, 2009   (CN) .......................... 2009 1 0303397

(51) Int. Cl.
*H05K 1/11* (2006.01)
*H05K 1/14* (2006.01)
(52) U.S. Cl. ........ 361/794; 361/763; 361/766; 361/792; 361/795
(58) Field of Classification Search .......... 361/763–766, 361/792–795
See application file for complete search history.

(56) References Cited

U.S. PATENT DOCUMENTS 5,719,750 A * 2/1998 Iwane ........................... 361/794
6,166,457 A * 12/2000 Iguchi et al. ................... 307/91
7,466,560 B2   12/2008 Hayashi et al.

* cited by examiner

*Primary Examiner* — Tuan T Dinh
(74) *Attorney, Agent, or Firm* — Altis Law Group, Inc.

(57) ABSTRACT

A printed circuit board includes a first signal layer, a first reference layer, a second reference layer, and a second signal layer. An integrated circuit mounted on the first signal layer includes a power supply terminal connected to a first power supply via. The second signal layer includes a filter and a power supply wire. The filter includes a power terminal connected to the first power supply via, and a ground terminal connected to the second reference layer. The first power supply via is connected to the first reference layer through the power supply wire and a second power supply via. A void defined in the second reference layer is at least partially vertically overlapping with the power supply wire, and enables the first reference layer to function as a reference plane for the power supply wire, to increase impedance of the power supply wire.

16 Claims, 2 Drawing Sheets

PRINTED CIRCUIT BOARD

BACKGROUND

1. Technical Field

The present disclosure relates to a printed circuit board (PCB).

2. Description of Related Art

Nowadays, higher functionality has been required for electronic devices, and accordingly, higher integration and a higher processing speed of an integrated circuit (IC), such as, an application specific integrated circuit (ASIC), mounted on a PCB, have been developed to meet this requirement. However, the higher integration and the higher processing speed of the IC cause changes in power supply and ground potential, and radiated noise generated by changes of the IC will reach a power supply layer of the PCB through a via, which leads to serious problems, such as, an adverse effect on other electronic elements and malfunction of the IC itself.

DETAILED DESCRIPTION

Figure 1:
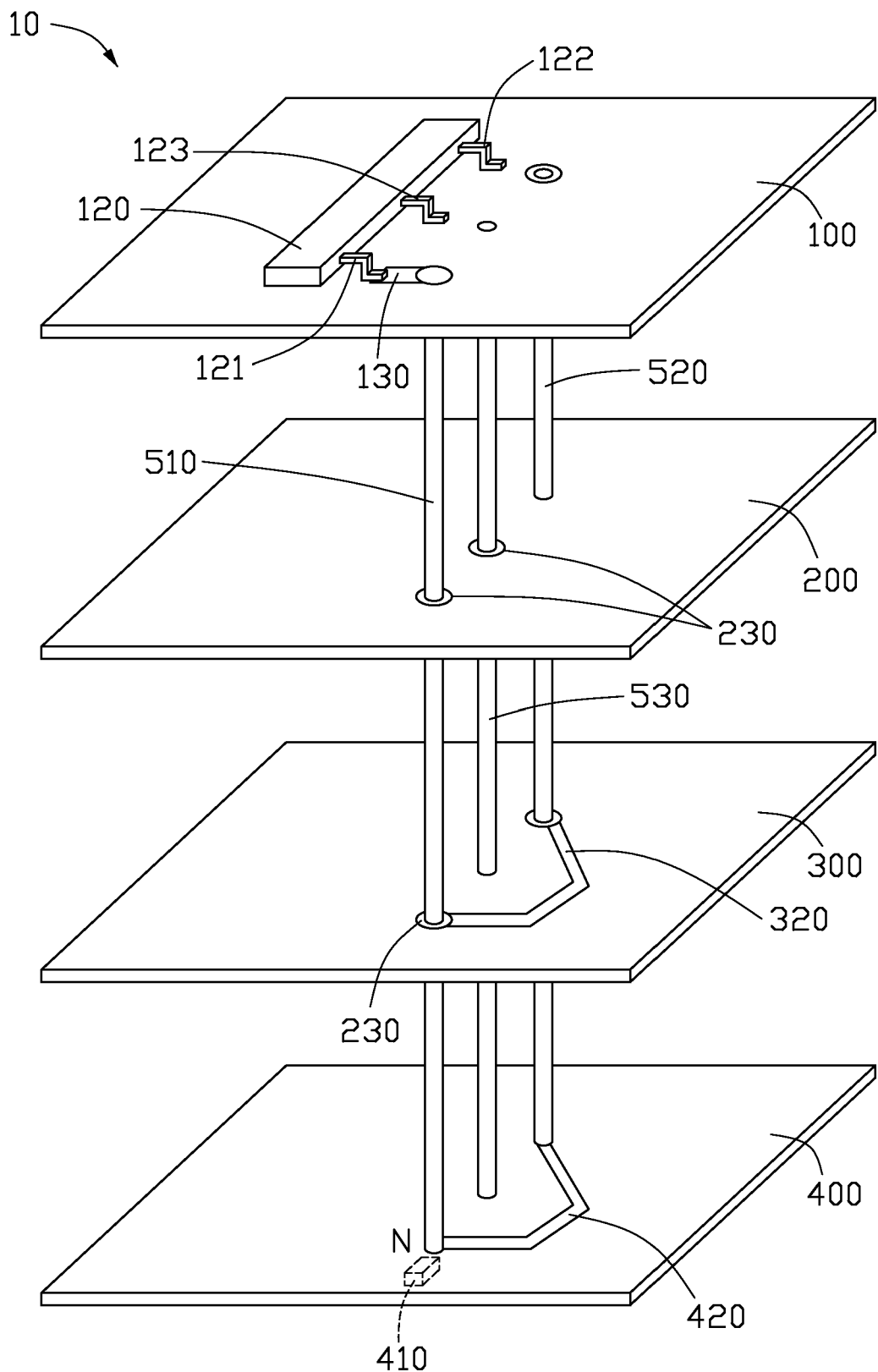
FIG. 1 is a schematic, isometric diagram of an embodiment of a printed circuit board.

Referring to FIG. 1, an exemplary embodiment of a printed circuit board (PCB) 10 includes a first signal layer 100, a power layer 200, a ground layer 300, a second signal layer 400, a first power supply via 510, a second power supply via 520, and a ground via 530. The first signal layer 100, the power layer 200, the ground layer 300, and the second signal layer 400 are configured in a cascading order, and every two adjacent layers are separated and insulated from each other by insulation layers (not shown). The power layer 200 functions as a first reference layer of the first signal layer 100 and the second signal layer 400, and also functions as a power supply system of the PCB 10. The ground layer 300 functions as a second reference layer of the first signal layer 100 and the second signal layer 400.

An integrated circuit (IC) 120 and a first power supply wire 130 are mounted on the first signal layer 100. The IC 120 includes a power supply terminal 121 that supplies power to the IC 120, a ground terminal 122 that supplies a reference potential to the IC 120, and an input/output (I/O) terminal 123 having a predetermined function for the IC 201. A filter, such as a capacitor 410, and a second power supply wire 420 are mounted on the second signal layer 400. It may be appreciated that the filter has characteristics such that impedance of the filter decreases as frequency of a signal flowing into the filter increases. A void 320 defined in the ground layer 300 is aligned over the second power supply wire 420. In one embodiment, the void 320 is formed by etching a copper foil of the ground layer 300, and the void 320 is vertically aligned with the second power supply wire 420. In another embodiment, the void 320 is at least vertically overlapping with the second power supply wire 420. The capacitor 410 is disposed on a bottom surface of the second signal layer 400 as indicated by the dashed lines in FIG. 1.

The first power supply via 510, the second power supply via 520, and the ground via 530 are through vias passing through the first signal layer 100, the power layer 200, the ground layer 300, and the second signal layer 400. The first power supply via 510 is connected to the power supply terminal 121 via the first power supply wire 130, and connected to the second power supply via 520 through the second power supply wire 420, while isolated from the power layer 200 and the ground layer 300 by two anti-pad regions 230. The second power supply via 520 is electrically connected to the power layer 200, while isolated from the ground layer 300 by an anti-pad region 230. The ground via 530 is electrically connected to the ground layer 300, while isolated from the power layer 200 by an anti-pad region 230. The capacitor 410 includes a power terminal connected to a node N at which the second power supply wire 420 is connected to the first power supply via 510 in the second signal layer 400, and a ground terminal connected to the ground terminal 122 of the IC 120 and the ground layer 300 through the ground via 530.

Figure 2:
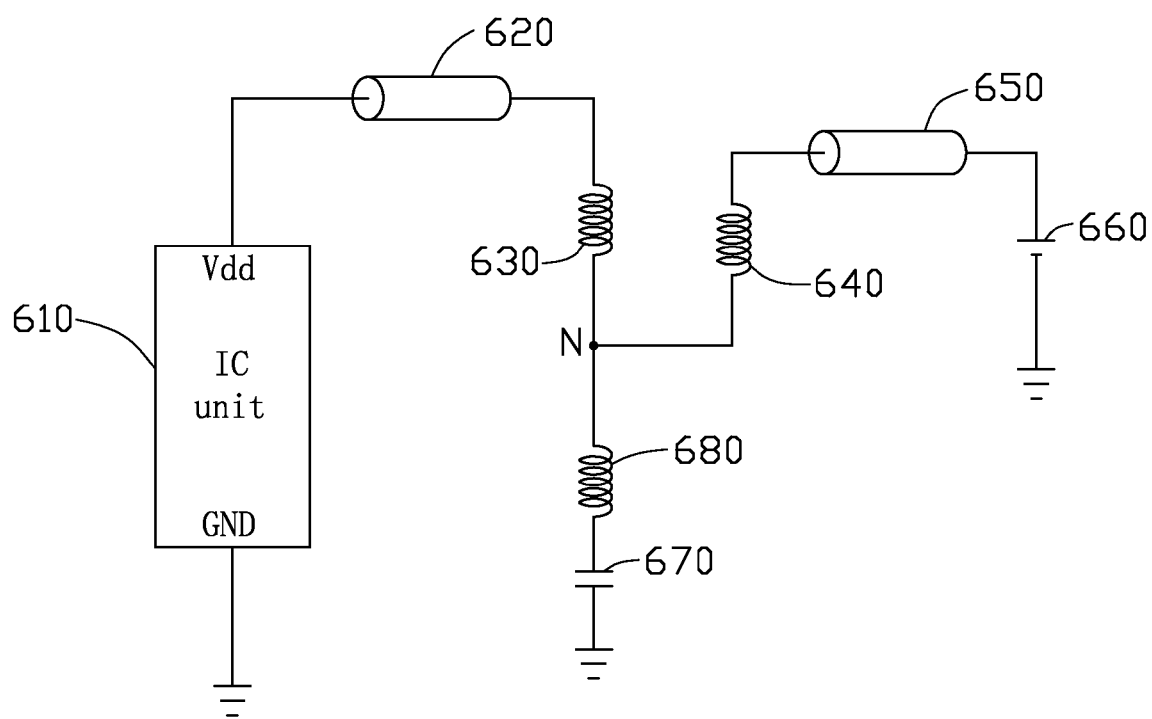
FIG. 2 is an equivalent circuit diagram of the printed circuit board of FIG. 1.

Referring to FIG. 2, an IC unit 610 that is equivalent to the IC 120 includes a power supply terminal Vdd equivalent to the power supply terminal 121, and a ground terminal GND equivalent to the ground terminal 122 shown in FIG. 1. A first transmission line 620 is equivalent to the first power supply wire 130 shown in FIG. 1. A first inductance 630 is equivalent to the first power supply via 510 shown in FIG. 1. A second inductance 640 is equivalent to an inductance of the second power supply wire 420 and a portion of the second power supply via 520 from the second signal layer 400 to the power supply layer 200. A second transmission line 650 is equivalent to the power supply layer 200 shown in FIG. 1. A direct-current (DC) voltage supply 660 is equivalent to a voltage supplied by the power supply layer 200 to the IC 120. A capacitor 670 is equivalent to the capacitor 410 shown in FIG. 1. A third inductance 680 is equivalent to a parasitic inductance of the capacitor 410 shown in FIG. 1.

In use, high-frequency noise is generated from the power supply terminal 121 by operating the IC 120. The high-frequency noise reaches the second signal layer 400 through the first power supply wire 130 and the first power supply via 510, and is branched into a first channel and a second channel at the node N. The first channel is to the power layer 200 via the second power supply wire 420 and the second power supply via 520, and the second channel is to the capacitor 410. The voltage supplied by the power supply layer 200 is offered to the IC 120 via the second power supply via 520, the second power supply wire 420, the first power supply via 510, and the first power supply wire 130.

The noise current that branches off to the power layer 200 and to the capacitor 410 is inversely proportional to the ratio of the impedance at the first channel to the impedance at the second channel, as viewed from the node N. In one embodiment, the impedance at the first channel is provided by the second inductance 640, the impedance at the second channel is provided by the third inductance 680, and the impedance at the first channel is greater than the impedance at the second channel. Furthermore, according to defining the void 320 in the ground layer 300 over the second power supply wire 420, the power layer 200 functions as the reference plane for the second power supply wire 420. Therefore, a distance between the second power supply wire 420 and the power layer 200 is greater than a distance between the ground layer 300 and the power supply wire 420, taking the ground layer 300 as a reference plane. Characteristic impedance of the second power supply wire 420 is increased, and the impedance of the second inductance 640 is increased accordingly. That is, the impedance at the first channel is much greater than the impedance at the second channel. Much of the noise current flows into and is filtered by the capacitor 410, therefore, the noise current flowing into the power layer 200 is suppressed, and the radiated noise can be reduced.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A printed circuit board, comprising:
   a first signal layer comprising an integrated circuit (IC), the IC comprising a power supply terminal;
   a second signal layer parallel to the first signal layer, comprising a filter and a first power supply wire;
   a first reference layer sandwiched between the first and second signal layers;
   a second reference layer sandwiched between the first reference layer and the second signal layer, and defining a void at least partially vertically overlapping with the first power supply wire;
   a first power supply via passing through the first and second signal layers, and the first and second reference layers, the first power supply via connected to the power supply terminal of the IC, while isolated from the first and second reference layers; and
   a second power supply via passing through the first and second signal layers, and the first and second reference layers, the second power supply via connected to the first power supply via through the first power supply wire, and connected to the first reference layer, while isolated from the second reference layer;
   wherein the filter comprises a power terminal connected to the first power supply via, and a ground terminal connected to the second reference layer; and
   wherein the void enables the first reference layer to function as a reference plane for the first power supply wire, to increase impedance of the first power supply wire.

2. The printed circuit board of claim 1, wherein the first signal layer further comprises a second power supply wire, the first power supply via is connected to the power terminal of the IC via the second power supply wire.

3. The printed circuit board of claim 1, wherein the first power supply via is isolated from the first and second reference layers by two anti-pad regions.

4. The printed circuit board of claim 1, wherein the second power supply via is isolated from the second reference layer by an anti-pad region.

5. The printed circuit board of claim 1, further comprising a ground via, wherein the ground terminal of the filter is connected to the second reference layer through the ground via.

6. The printed circuit board of claim 1, wherein the void is formed by etching a copper foil of the second reference layer.

7. The printed circuit board of claim 1, wherein the first reference layer is a power layer.

8. The printed circuit board of claim 1, wherein the second reference layer is a ground layer.

9. The printed circuit board of claim 1, wherein the filter is a capacitor.

10. A printed circuit board, comprising:
    a first signal layer comprising an integrated circuit (IC), the IC comprising a power supply terminal;
    a second signal layer parallel to the first signal layer, comprising a filter and a first power supply wire;
    a power layer sandwiched between the first and second signal layers;
    a ground layer sandwiched between the power layer and the second signal layer, and defining a void at least partially vertically overlapping with the first power supply wire;
    a first power supply via passing through the first and second signal layers, the power layer, and the ground layer, and connected to the power supply terminal of the IC, while isolated from the power layer and the ground layer; and
    a second power supply via passing through the first and second signal layers, the power layer, and the ground layer, the second power supply via connected to the first power supply via through the first power supply wire, and connected to the power layer, while isolated from the ground layer;
    wherein the filter comprises a power terminal connected to the first power supply via, and a ground terminal connected to the ground layer; and
    wherein the void enables the power layer to function as a reference plane for the first power supply wire, to increase impedance of the first power supply wire.

11. The printed circuit board of claim 10, wherein the first signal layer further comprises a second power supply wire, the first power supply via is connected to the power terminal of the IC via the second power supply wire.

12. The printed circuit board of claim 10, wherein the first power supply via is isolated from the power layer and the ground layer by two anti-pad regions.

13. The printed circuit board of claim 10, wherein the second power supply via is isolated from the ground layer by an anti-pad region.

14. The printed circuit board of claim 10, further comprising a ground via, wherein the ground terminal of the filter is connected to the ground layer through the ground via.

15. The printed circuit board of claim 10, wherein the void is formed by etching a copper foil of the ground layer.

16. The printed circuit board of claim 10, wherein the filter is a capacitor.

* * * * *